(12) United States Patent
Fouillet

(10) Patent No.: US 6,812,820 B1
(45) Date of Patent: Nov. 2, 2004

(54) MICROSYSTEM WITH ELEMENT DEFORMABLE BY THE ACTION OF HEAT-ACTUATED DEVICE

(75) Inventor: Yves Fouillet, Voreppe (FR)

(73) Assignee: Commissariat a l'Energie Atomique, Paris (FR)

( * ) Notice: Subject to any disclaimer, the term of this patent is extended or adjusted under 35 U.S.C. 154(b) by 0 days.

(21) Appl. No.: 09/554,272
(22) PCT Filed: Dec. 14, 1998
(86) PCT No.: PCT/FR98/02719

§ 371 (c)(1),
(2), (4) Date: Jun. 6, 2000

(87) PCT Pub. No.: WO99/31689

PCT Pub. Date: Jun. 24, 1999

(30) Foreign Application Priority Data

Dec. 16, 1997 (FR) ............................................ 97 15931

(51) Int. Cl.$^7$ ........................ H01H 37/32; H01H 37/02
(52) U.S. Cl. .......................... 337/333; 337/370; 337/78
(58) Field of Search ............................ 337/333, 36, 39, 337/40, 78, 335, 337, 370

(56) References Cited

U.S. PATENT DOCUMENTS

| | | | | |
|---|---|---|---|---|
| 4,806,815 A | * | 2/1989 | Honma | 310/307 |
| 5,029,805 A | * | 7/1991 | Albarda et al. | 251/11 |
| 5,058,856 A | * | 10/1991 | Gordon et al. | 251/11 |
| 5,061,914 A | * | 10/1991 | Busch et al. | 337/140 |
| 5,182,910 A | * | 2/1993 | Benecke | 60/529 |
| 5,325,880 A | * | 7/1994 | Johnson et al. | 137/1 |
| 5,536,963 A | * | 7/1996 | Polla | 257/417 |
| 5,619,061 A | * | 4/1997 | Goldsmith et al. | 257/528 |
| 5,619,177 A | * | 4/1997 | Johnson et al. | 337/140 |
| 5,635,750 A | * | 6/1997 | Schlaak et al. | 257/414 |
| 5,638,946 A | * | 6/1997 | Zavracky | 200/181 |
| 5,681,024 A | * | 10/1997 | Lisec et al. | 251/11 |
| 5,796,152 A | * | 8/1998 | Carr et al. | 257/415 |
| 6,236,300 B1 | * | 5/2001 | Minners | 337/139 |
| 6,239,685 B1 | * | 5/2001 | Albrecht et al. | 337/365 |

FOREIGN PATENT DOCUMENTS

DE 19516997 A1 * 11/1995 ............. B41J/2/45

OTHER PUBLICATIONS

Popescul, et al., "Buckled Membranes for Microstructures", 1994, 4 pages.
Timoshenko, "Analysis of Bi–Metal Thermostats", 23 pages.
Patent No. DE19516997A1, Abstract in English.

* cited by examiner

Primary Examiner—Anatoly Vortman
(74) Attorney, Agent, or Firm—Thelen Reid & Priest LLP

(57) ABSTRACT

The invention concerns a microsystem, in particular for producing microswitches or microvalves, constituted on a substrate (50) and used for producing a shift between a first operating state and a second operating state by means of a heat actuated device with bi-metal switch effect. The heat-actuated device comprises a deformable element (51) connected, by opposite ends, to the substrate (50) so as to present naturally a deflection without stress relative to the substrate surface which faces it, said natural deflection determining the first operating state, the second operating state being produced by the heat-actuated device which induces, by the effect of temperature variation, a deformation of the deformable element (51) tending to reduce its deflection and submitting it to a compressive stress by buckling effect in a direction opposite to its natural deflection.

16 Claims, 6 Drawing Sheets

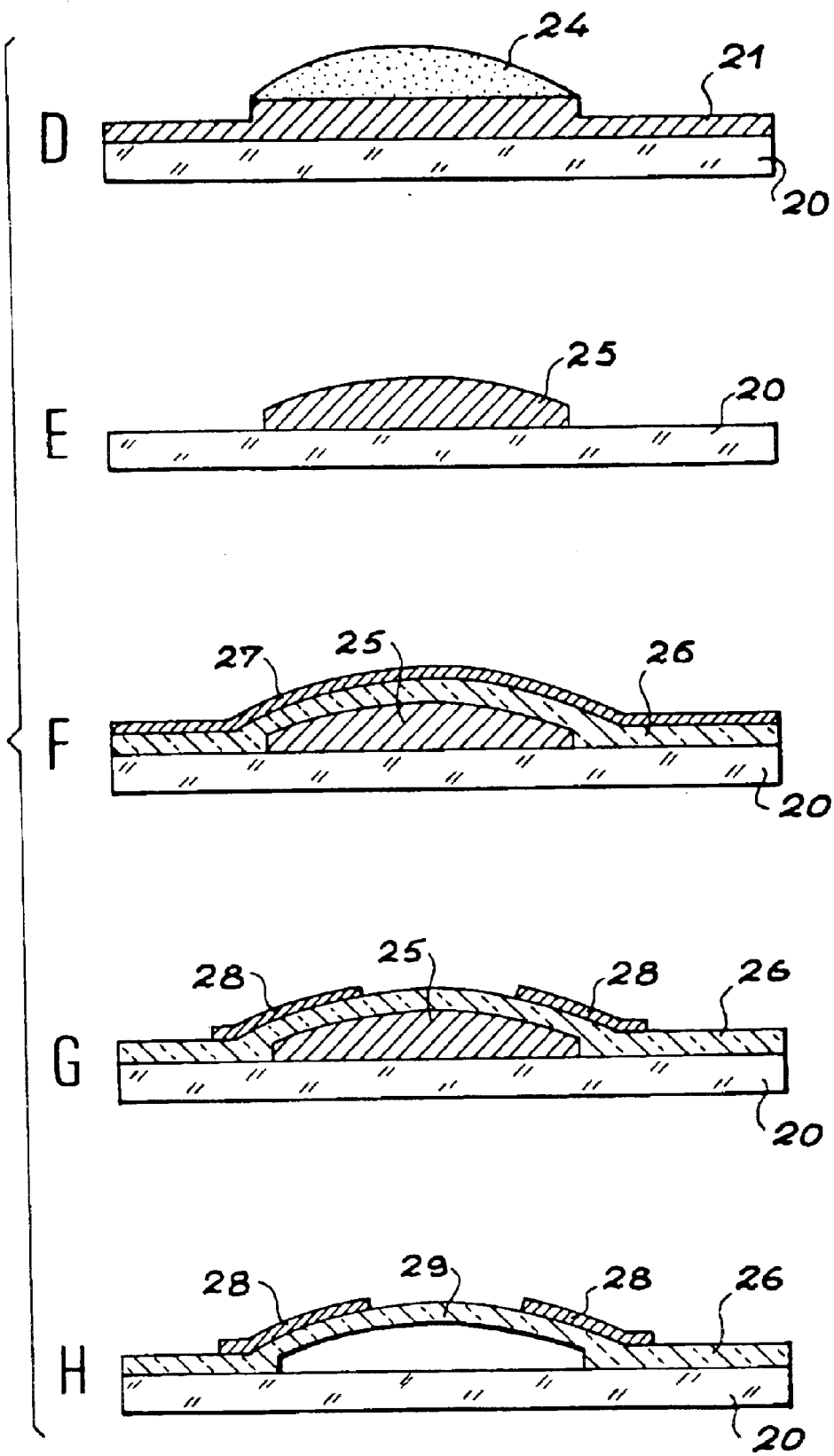

MICROSYSTEM WITH ELEMENT DEFORMABLE BY THE ACTION OF HEAT-ACTUATED DEVICE

FIELD OF THE INVENTION

The present invention involves a microsystem with an element which can be deformed by the action of a thermal sensor. Such microsystems can be applied to microswitches for opening or closing electric circuits and microvalves for microfluid applications.

These Microsystems include an element in the form of a beam or a membrane which is deformed by heat. Strongly non-linear behaviour is sought in order to obtain a rapid shift between the two states, an open state and a closed state.

It must be possible to design these Microsystems so that they can be compatible with the making of microelectronic components.

STATE OF THE ART

The microsensors used to trigger the deformation of the deformable element of a microsystem can be put in three main categories as a function of the principles used. First, thermal actuators which use thermal dilatation of one or several of their components. There are also electrostatic actuators which use the electrostatic force generated between two elements with different charges.

Lastly there are magnetic actuators which use forces induced by a magnetic field.

There are also actuators which use piezoelectric and magnetostrictive materials.

The thermal actuators appear to be the most useful because they generally allow for larger deformations than electrostatic actuators whereas magnetic actuators, or those which use piezoelectric and magnetostrictive materials, are generally difficult to use with classic micro-machining processes, particularly for manufacturing which requires technological compatibility with microelectronics. In addition, with a thermal actuator, it is easy to generalise the use of a controlled microswitch to a thermal microswitch (change of state as of a critical temperature) or to a micro circuit breaker (change of state as of a certain critical current intensity).

The simplest way to make a thermal actuator is to use a bimetal. This technique involves two layers of materials having different thermal dilatation coefficients so that a variation in temperature of the whole unit causes a deflection of the bimetal. Temperature elevation is obtained by the Joule effect either by directly passing an electrical current into one of the two layers of the bimetal or into the resistors formed on one of these layers and obtained, for example, by implantation if one of the layers is made of silicon.

The deformation of the bimetal depends on the type of attachment to its support. FIG. 1 shows the deformation due to the effect of a thermal stress on a free bimetal, i.e. at the ends which are not attached but merely supported, composed of a layer 1 and a layer 2 with different thermal dilatation coefficients. The broken line shows the average position of the bimetal in the absence of a thermal stress. The theory shows that in this case the radius of curvature ρ is uniform. It is negative if the coefficient of dilatation of layer 2 is greater than that of layer 1.

If the deformable structure is embedded at its ends, it is preferable, because of the appearance of the deformity, to place the bimetal in the areas where the dilatation effect acts in the direction of the curvature. Depending on the location of the bimetal, an increase in temperature may deflect the structure in one direction or another.

FIG. 2 shows a first bimetal structure of this type. It includes a first layer 3 and a second layer 4 formed of two parts. The broken line indicates the average position of the bimetal in the absence of a thermal stress. As the thermal dilatation coefficient of the layer 4 is greater than that of the layer 3, the deformation of the bimetal structure due to the effect of dilatation is in the direction indicated in FIG. 2.

FIG. 3 shows a second bimetal structure embedded at its ends. It has a first layer 5, which is embedded, and a second layer 6 which is located on the central part of the layer 5. The broken line indicates the average position of the bimetal in the absence of a thermal stress. As the thermal dilatation coefficient of the layer 6 is greater than that of the layer 5, the deformation of the bimetal structure due to the effect of dilatation is in the direction indicated in FIG. 3.

The amplitude f of the deformation is proportional to the temperature and the deformation thus depends on the surrounding temperature. It is possible however to find structural configurations so that the deformation is independent of the surrounding temperature.

Due to the complex mechanisms involved during the opening and closing of an electric circuit however (electric arc, bounce phenomena, etc.), it is preferable to seek systems for which the change in state (the shift from the open state of the circuit to its closed state) is as rapid as possible. The ideal would be designing systems having a critical temperature beyond which the mechanical equilibrium state changes. This cannot be obtained with just a bimetal however.

The patent U.S. Pat. No. 5,463,233 discloses a micro-machined thermal switch which combines a bimetal and an electrostatic sensor. In the absence of deformation of the bimetal, the electrostatic force is weak, the bimetal is in equilibrium between the electrostatic force and the mechanical restoring force of the structure. When the temperature increases, the bimetal effect brings the electrodes of the sensor closer until the electrostatic force becomes sufficiently strong to overcome the mechanical restoring force and to thus trigger the instantaneous shift of the structure.

Another way to generate a displacement by a change in temperature is to heat an embedded beam or membrane. FIG. 4 shows an embedded membrane 7 in resting position along the broken line and the deformed position by the solid line. The thermal dilatation compresses the structure. The theory of beams or membranes shows that there is a critical compression stress (and thus a temperature) beyond which the structure buckles. The article "Buckled Membranes for Microstructures" by D. S. Popescu et al., which appeared in the IEEE review, pages 188–192 (1994), describes such as structure in compression. In the case of a beam of thickness h, length L, made from a material with a dilatation coefficient α, the critical compression stress is given by the equation:

$$\theta_{cr} = \frac{\pi^2 h^2}{3\alpha L^2} \quad (1)$$

The theory also shows that the amplitude f of the deformity of the structure is given by the equation:

$$f = \pm \sqrt{\frac{\theta}{\theta_{cr}} - 1} \qquad (2)$$

In the case of a square membrane, A is 2.298 h. One of the drawbacks of this method is the indeterminate nature of the sign of f. As FIG. 4 shows, the membrane 7 may be deformed in the opposite direction and take the position indicated by the broken line. Equation (2) also shows that it is difficult to obtain high displacement amplitudes for structures made by surface technologies, i.e. in thin layers.

Another solution derived from the preceding one is to use a naturally buckled membrane. This is obtained by using silicon oxide membranes for example. The system thus has two stable positions $$f = \pm A \sqrt{\frac{S}{S_{cr}} - 1},$$

where S is the internal stress and $S_{cr}$ is the critical buckling stress. To shift from one position to another an additional mechanical action is needed. In the article mentioned above by D. S. Popescu et al., this additional mechanical action is from a field of pressure on the membrane.

Embedded bimetals were studied in the article "Analysis of Mi-metal Thermostats" by TIMOSHENKO which appeared in the Journal of the Optical Society of America, vol. 11, pages 233–255, 1925. This article gives in particular a theoretical study of the structure shown in FIG. 5. The deformable structure is a beam 10 composed of a bimetal, the ends of which are held by two fixed supports 11 and 12. The retention of the ends eliminates the degree of freedom of translation but leaves the freedom of rotation along an axis perpendicular to the plane of the figure. At rest, i.e. at a temperature such that there is no thermal stress due to the bimetal effect, the beam, shown in solid lines in FIG. 5, shows an initial deformation in a circle arc of radius $\rho_0$. When the temperature increases, the following effects are produced:

1st effect: the longitudinal thermal dilatation of the beam being blocked by the supports 11 and 12, the beam is subjected to a compression force.

$2^{nd}$ effect: the bimetal is made so that an increase in temperature causes an increase in the curvature. This produces a downward deflection of the beam in FIG. 5, 3rd effect: due to the preceding effect, the length of the beam decreases. This induces an additional internal compression stress in the beam.

The first and third effects favour buckling of the structure, leading to shifting of the beam once a certain critical temperature is reached. The beam then takes the position indicated by the broken lines in FIG. 5.

The systems of the prior art mentioned above show characteristics such that they cannot give a microsensor to deflect a membrane or a beam using the thermal dilatation effects with the following advantages:

non-linearity between temperature and deflection to produce a sudden change (shift and notion of critical temperature) with a high amplitude;

no sensor other than that which produces the thermal dilatation effect;

use of a thin-layer manufacturing technique, which requires rigid embedding for the deformable element.

BRIEF DESCRIPTION OF THE INVENTION

To overcome the above-mentioned drawbacks, a microsystem is proposed which has its deformable element (beam or membrane) naturally deflected at rest, this initial deflection not being of the buckling type. The deformable element is thus non-planar, as predefined by its construction. This deformable element is embedded and the deformation caused by the thermal sensor results from a bimetal effect and a buckling phenomenon induced by thermal dilatation. In the resting state, the embedding does not place any force on the deformable element.

The invention thus involves a microsystem on a substrate which is used to produce a shift between a first state of functioning and a second state of functioning by means of a thermal actuator with a bimetal effect, the aforesaid actuator including a deformable element attached, by its opposite ends, to the substrate so that it naturally has a deflection without stress with respect to a surface of the substrate which is opposite it, this natural deflection determining the aforesaid first state of functioning, the aforesaid second state of functioning being triggered by the aforesaid thermal actuator which induces, due to a temperature variation effect, a deformation of the deformable element tending to diminish its deflection by subjecting it to a compression stress which causes its shifting by a buckling effect in the direction opposite to that of its natural deflection. When the thermal control triggered by the actuator is eliminated, the microsystem returns to its first state of functioning.

The first state of functioning can correspond to a position of the deformable element which is the furthest from the aforesaid surface of the substrate, the aforesaid second state of functioning corresponding to a position of the deformable element closest to the aforesaid surface of the substrate. The inverse situation is also possible.

The central part of the deformable element can be thicker than its peripheral part.

The invention also involves a microswitch composed of a microsystem as defined above, a system of electrodes being included in the microsystem, on the surface of the substrate and on the deformable element so that there is electrical continuity between electrodes in one of the aforesaid states of functioning and an absence of electrical continuity in the other of the aforesaid states of functioning.

The invention also involves a microvalve composed of a microsystem as defined above, a fluid flow orifice being included in the microsystem so that it is blocked in one of the aforesaid states of functioning and open in the other of the aforesaid states of functioning.

The invention also involves a process for manufacturing a microsystem as defined above, characterised in that:

the deformable element is obtained by depositing of an appropriate layer of material on the aforesaid surface of the substrate, this layer being attached to the aforesaid surface with the exception of a part which forms an arch above the aforesaid surface and which constitutes the deformable element, means, obtained by depositing, are in close contact with the aforesaid deformable element and constitute, along with it, the aforesaid thermal actuator with bimetal effect.

The part forming the arch is advantageously obtained by a prior deposit on the aforesaid surface of the substrate of a sacrificial mass to give a definite shape to the aforesaid deformable element once the sacrificial mass has been sacrificed, the sacrificial mass being provided so that, at the end of the process, the aforesaid deformable element naturally has a deflection without stress with respect to the aforesaid surface of the substrate.

According to a first variant, the process includes the following successive steps:

depositing of a layer of sacrificial material on the aforesaid surface of the substrate, obtaining on the layer of sacrificial material a mass of material which can flow without altering the substrate and the sacrificial material, flowing of the material which can flow to give at a shape which is complementary to the desired arch shape of the deformable element, etching of the layer of sacrificial material and of the material which has flowed until there remains on the aforesaid surface of the substrate only the aforesaid sacrificial mass which reproduces the shape of the material which flowed, depositing of the layer which will provide the deformable element, depositing of the means to form, with the aforesaid deformable element, the aforesaid thermal actuator, elimination of the sacrificial mass.

In this case, the mass of material to flow can be obtained by depositing of a layer of photosensitive resin on the sacrificial material layer and by etching of this layer of photosensitive resin so that only the mass of material which flows remains.

According to a second variant, the process includes the following steps:

obtaining on the aforesaid surface of the substrate a sacrificial mass, with a step profile, and of a shape essentially complementary to the shape of the arch desired for the deformable element, depositing of the layer to form the deformable element, depositing of the means to form, with the aforesaid deformable element, the aforesaid thermal actuator, elimination of the sacrificial mass.

In this case, the sacrificial mass can be obtained by depositing on the aforesaid surface of the substrate of a layer of sacrificial material and by successive etchings of this layer of sacrificial material until the surface of the substrate is reached with the exception of the place of the deformable element where the etching lets the aforesaid sacrificial mass remain.

According to a third variant, the process includes the following successive steps:

obtaining on the aforesaid surface of the substrate a sacrificial mass of uniform thickness at the place of the deformable element, depositing of the layer to provide the deformable element, the deposit being done so that the part of this layer which covers the mass of sacrificial material is naturally under stress, depositing, on the previously deposited layer, of a layer in which will be formed the means to form, with the aforesaid deformable element, the aforesaid thermal actuator, this deposit being done at a determined temperature so that, at the end of the process, the deformable element is naturally deflected, etching of the previously deposited layer to form the means, with the aforesaid deformable element, for the aforesaid thermal actuator, elimination of the sacrificial mass.

In this case, the sacrificial mass can be obtained by depositing on the aforesaid surface of the substrate of a layer of sacrificial material and by etching of this layer of sacrificial material.

Regardless of the process used, it may be necessary to include a step involving opening the deformable element so that the opening of this deformable element allows for elimination of the sacrificial mass.

BRIEF DESCRIPTION OF THE DRAWINGS

The invention will be better understood with the description which follows, given as a non-limiting example, accompanied by the appended drawings among which.

DETAILED DESCRIPTION OF EMBODIMENTS OF THE INVENTION

In general, structures obtained by microtechnology processes have planar geometry. Manufacturing of naturally deflected beams or membranes thus requires particular attention.

The processes which will now be described deposit the deformable element on a layer called the sacrificial layer which is then eliminated at the end of the process. A $Si_3N_4$ deformable element (beam or membrane) can be made using a sacrificial layer of tungsten.

Figure 1:
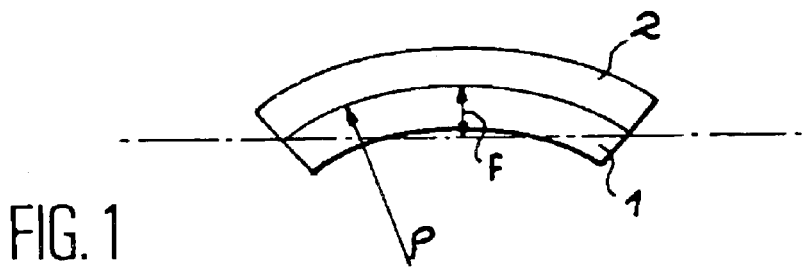
FIGS. 1 to 5, already described, represent devices with elements which are deformable through the effect of a thermal actuator.
Figure 2:
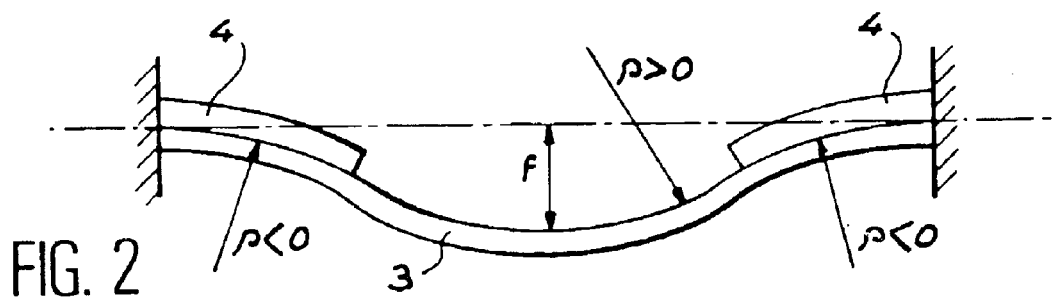
Figure 3:
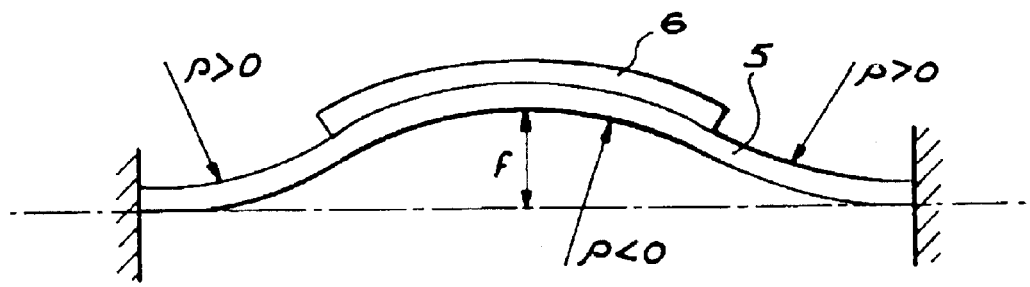
Figure 4:
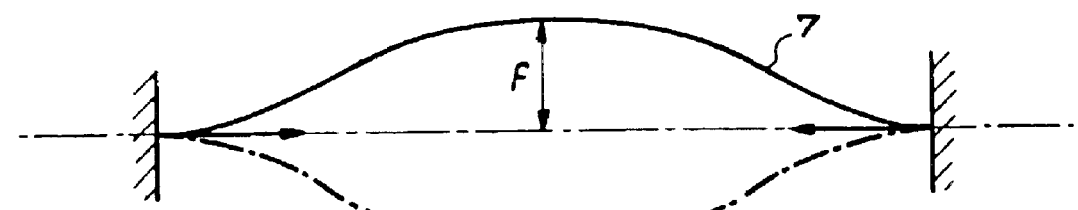
Figure 5:
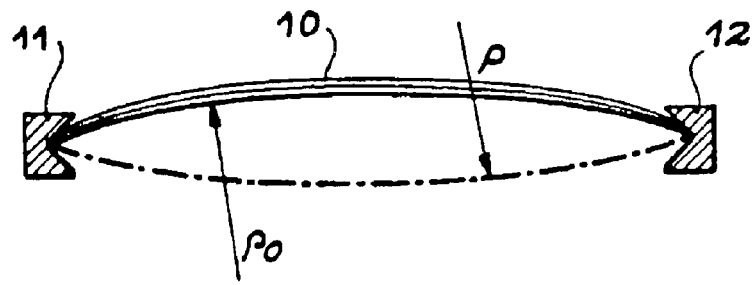
Figure 6:
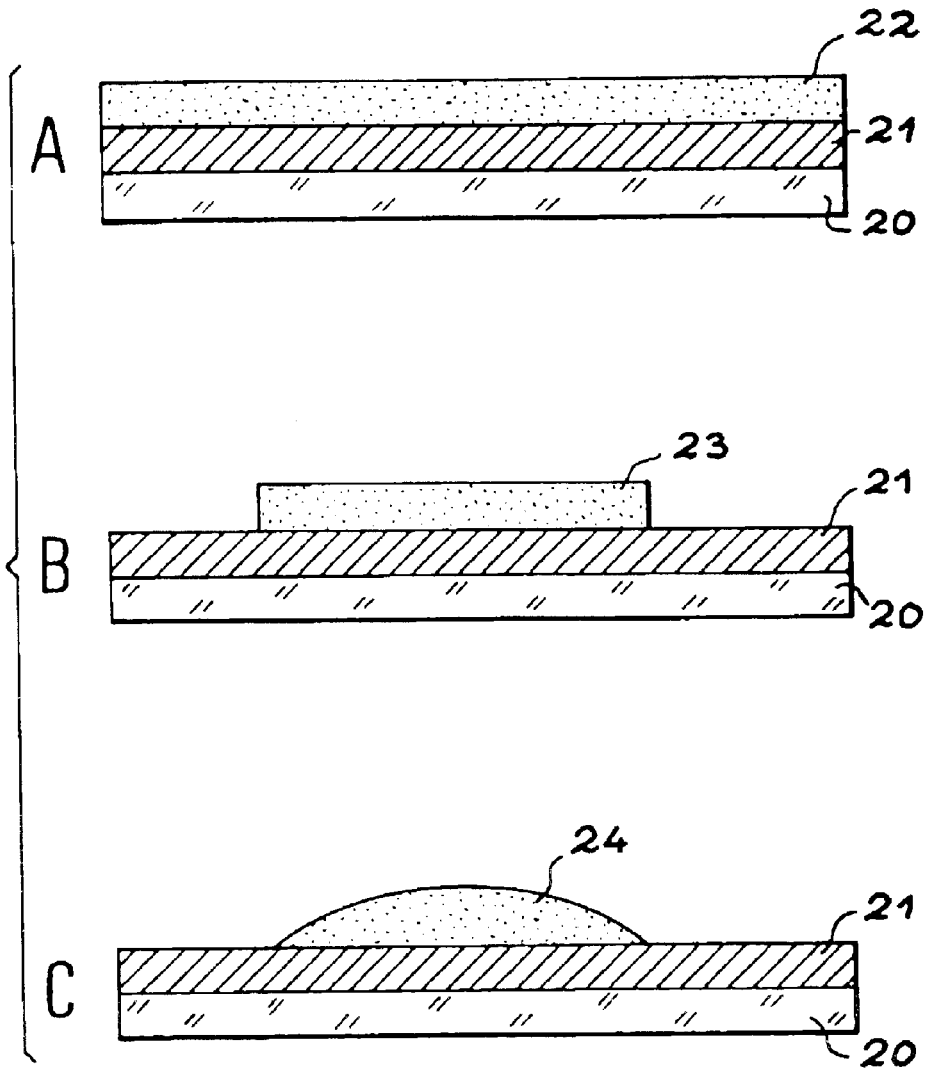
FIGS. 6A to 6H illustrate a first variant of a process for manufacturing a microsystem with an element which is deformable through the effect of a thermal actuator according to the present invention.

A first variant of the process according to the invention illustrated by FIGS. 6A to 6H yields a microsystem with a deformable element (beam or membrane) which is non-planar and non-forced. On a substrate 20, made of glass for example, the sacrificial layer 21 (made of tungsten for example) is first deposited, then a layer of photosensitive resin 22 (FIG. 6A). The resin layer is etched to leave only a mass of resin 23 of which the area is determined by the desired deformable element (FIG. 6B). By thermal treatment, the flow of the photosensitive resin is triggered. This yields a mass 24 with a shape complementary to that of the arch desired for the deformable element (FIG. 6C).

The sacrificial layer 21 is then etched. FIG. 6D shows a first step of etching where the sacrificial layer 21 is etched on part of its thickness at the places where this layer is not masked by the mass 24 of resin. FIG. 6E shows a second etching step in which the mass 24 of resin has been eliminated, by reactive ionic etching for example. The sacrificial layer was simultaneously etched, reproducing the shape of the mass 24 in FIG. 6D. A mass 25 of sacrificial material is obtained.

The sacrificial mass as shown in FIG. 6E can be obtained directly by using an organic material (a polyimide for example) as long as this material can flow and withstand the steps in the manufacturing of the deformable element without degradation.

The surface of the substrate 20 supporting the sacrificial mass 25 is then covered with a layer 26, for example of $Si_3N4$ or silicon, then a layer 27 of a conducting material such as aluminium, gold or nickel (see FIG. 6F). The materials of layers 25 and 26 must have different thermal dilatation coefficients while being compatible with the later step of freeing the deformable element.

The layer 27 is then etched (see FIG. 6G) to demarcate the parts 28 of the thermal actuator.

The layer 26 is also etched. This etching is determined as a function of the shape which is desired for the deformable element (beam or membrane). It also allows for opening the deformable element in order to allow for elimination of the sacrificial mass 25.

This yields the microsystem illustrated by FIG. 6H with a deformable element 29 which is naturally deflected with respect to the surface of the substrate 20.

A second variant of the process according to the invention, illustrated by FIGS. 7A to 7D, yields a microsystem with a non-planar and non-forced deformable element. A sacrificial layer 31 (see FIG. 7A) is deposited on a surface of a substrate 30. This sacrificial layer is etched several times and with as many masks as needed to obtain a sacrificial mass 32, with a step profile, and in a shape which is essentially complementary to the shape of the arch desired for the deformable element. Around the sacrificial mass 32, the surface of the substrate is apparent (see FIG. 7B). As before, a layer 33 and a layer 34 to form the deformable element and the thermal actuator are then deposited.

As before, the layer 34 is etched to obtain the parts 35. Likewise, the layer 33 is etched as a function of the desired shape of the deformable element and to open this deformable element in order to eliminate the sacrificial mass 32.

Figure 7:
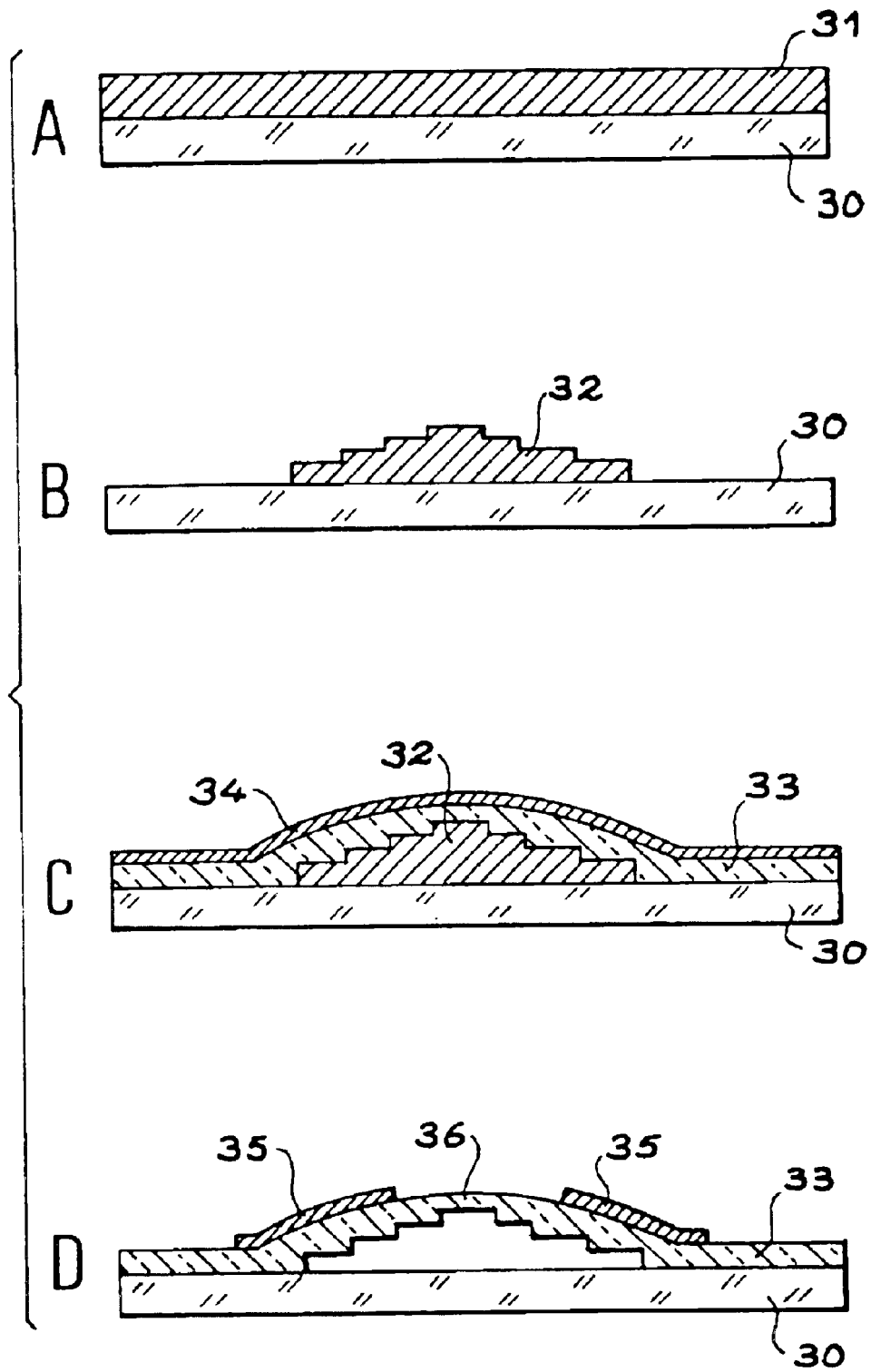
FIGS. 7A to 7D illustrate a second variant of a process for manufacturing a microsystem with an element which is deformable through the effect of a thermal actuator according to the present invention.

The microsystem illustrated by FIG. 7D with a deformable element 36 which is naturally deflected with respect to the surface of the substrate 30 is obtained. The materials used can be the same as before.

A third variant of the process according to the invention, illustrated by FIGS. 8A to 8D, yields a microsystem with a planar and prestressed deformable element in which the temperature difference will be adjusted during the formation of the two parts of the bimetal.

Figure 8:
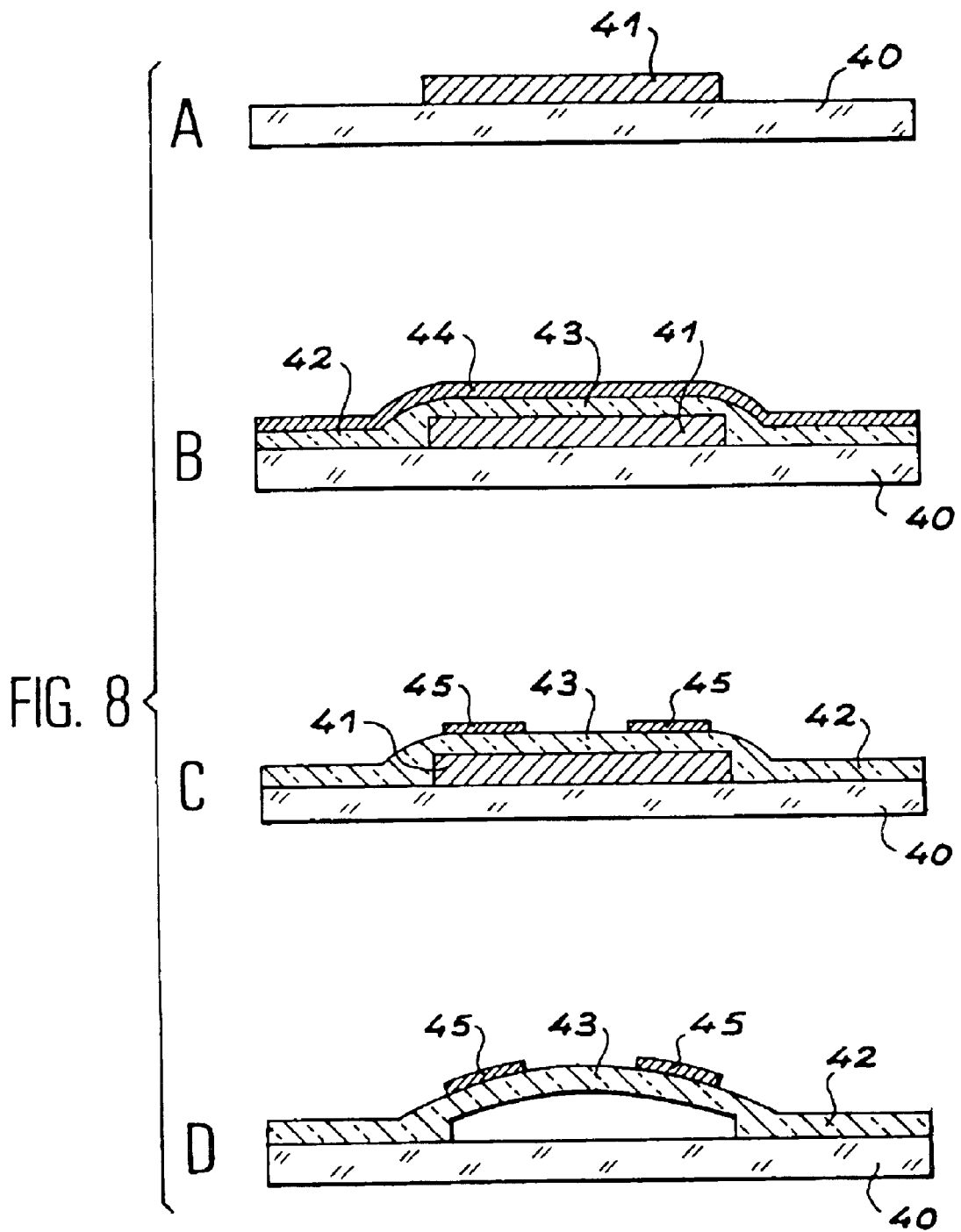
FIGS. 8A to 8D illustrate a third variant of a process for manufacturing a microsystem with an element which is deform able through the effect of a thermal actuator according to the present invention.

A sacrificial layer is deposited on the surface of a substrate 40 and is then etched to yield a mass 41 of uniform thickness at the place of the future deformable element (see FIG. 8A). Then a layer 42, made of $SiO_2$ or $Si_3N_4$ for example, is deposited so that it covers the sacrificial mass 41 and the apparent surface of the substrate. This yields a part 43 of the layer 42, which is rectilinear above the sacrificial mass 41 and naturally stressed (see FIG. 8B). A second layer 44 is then deposited at a temperature greater than the surrounding temperature thus producing, at the end of the process, a natural deflection of the deformable element.

As before, the layer 44 is etched to obtain parts 45 (see FIG. 8C). Likewise, the layer 42 is etched a s a function of the desired shape of the deformable element and to open this deformable element in order to eliminate the sacrificial mass 41.

This yields the microsystem illustrated by FIG. 8D with a deformable element 43 which is naturally deflected with respect to the surface of the substrate 40. The e value of the prestress in the layer 42 must be adjusted to give buckling only when the bimetal structure is activated.

For example, the deformable element could be made of a beam of $Si_3N_4$ 1 $\mu$m thick and 200 $\mu$m long. The initial deflection (at room temperature) of the beam can be 2 $\mu$m. The rest of the bimetal structure can be made of aluminium and can be 1 $\mu$m thick. The structure shifts for a temperature variation between 100 and 120° C. The amplitude obtained is on the order of 5 $\mu$m while for a temperature variation from 0 to 100° C. the deflection is less than 1 $\mu$m.

The following figures illustrate examples of applications of the invention which can be obtained with the processes described above.

Figure 9:
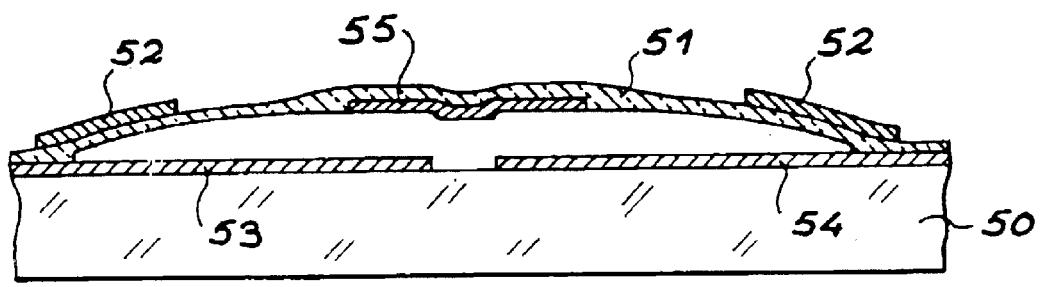
FIG. 9 is a cross section of a microswitch according to the present invention in the open state.

FIG. 9 shows a microswitch formed on a substrate 50. The bimetal is made of a deformable element 51, for example in the form of a beam, and of two parts 52. During the microsystem manufacturing process, electrodes 53, 54 and 55 were included. Electrodes 53 and 54 were made before the depositing of the sacrificial mass. Electrode 55 was made on the sacrificial mass, before the depositing of the bimetal layers.

Figure 10:
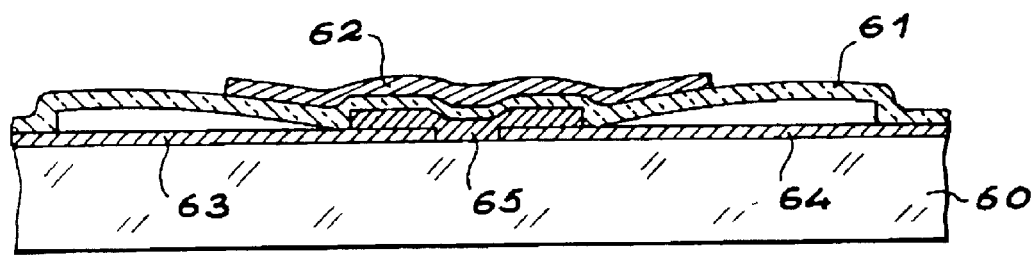
FIG. 10 is a cross section of a microswitch according to the present invention in the closed state.

It is also possible to design a microswitch which is normally closed as FIG. 10 demonstrates. The microswitch was formed on a substrate 60. The bimetal is made of a deformable element 61 (beam or membrane) and a part 62. Electrodes 63 and 64 were made before the depositing of the sacrificial mass. Electrode 65 was made on the sacrificial mass, before the depositing of the bimetal layers.

The normally closed state for the microswitch is obtained by using the third variant of the process according to the invention and centering the part 62 on the deformable element 61.

It is clear that when the bimetal of FIGS. 9 and 10 shifts, there is a passage from the given functioning state to another functioning state. For FIG. 9, the shift of the bimetal allows for passage from the open state (case shown in FIG. 9) to the closed state by the bringing into contact of the electrode 55 with the electrodes 53 and 54. The microsystem of FIG. 10 functions inversely.

Figure 11:
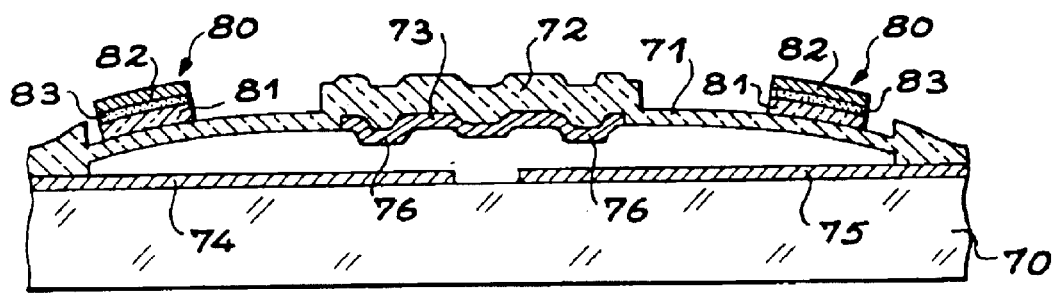
FIG. 11 is a cross section of another microswitch according to the present invention in the open state.

In order to provide a good electrical contact between the electrodes when the microswitch is closed, it is advantageous to make the modifications shown in FIG. 11. This figure represents a microswitch which is normally open, formed on a substrate 70 supporting the electrodes 74 and 75. The deformable element 71 is formed by a thick layer, locally thinned in order to rigidify the central part 72, which is thus thicker, at the level of the electrode 73 borne by this central part. This also limits the influence of thermal dilatation induced by the electrode 73.

Depending on the deposit thickness of the various layers, and according to the process used, it may also be advantageous to localise the areas of contact between the electrode 73 and the electrodes 74 and 75. This can be obtained by a step of planarisation of the sacrificial layer or, as shown in FIG. 11, by making insets 76 obtained by photoetching of the sacrificial layer.

Another possible improvement involves using different materials to make the other part of the bimetal, referenced as 80 on FIG. 11. The parts 80 can include a first layer 81 adjacent to the deformable element and of high resistivity (made of TiN for example), acting as a heating element. A second layer 82, superposed on the layer 81, having a high dilatation coefficient, has a thermomechanical role. The layer 82 can be made of aluminium. Depending on the materials used, it mat be necessary to isolate the layers 81 and 82 by a fine layer of passivation 83.

Figure 12:
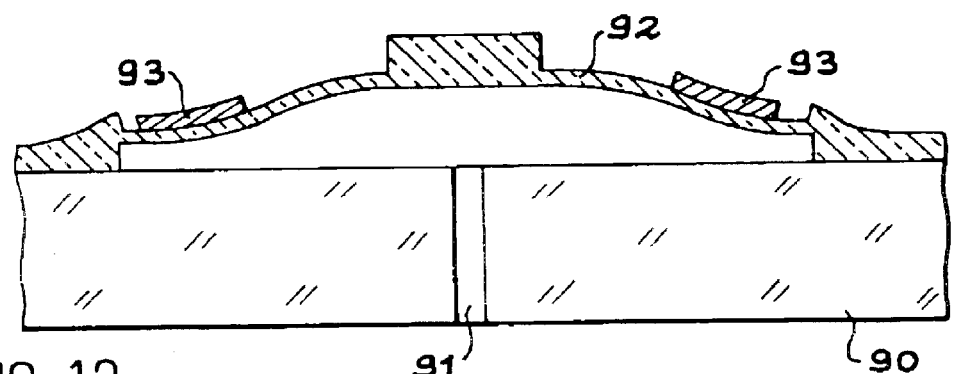
FIG. 12 is a cross section of another microswitch according to the present invention in the closed state.

FIG. 12 shows a cross section of a microvalve composed of a substrate 90 pierced by a hole 91 which connects the two opposite sides of the substrate. The microvalve has a bimetal structure including a deformable element 92 and one or several parts 93. The deformable element closes or opens the hole 91 as a function of the temperature induced in the bimetal.

What is claimed is:

1. Microsystem assembled on a surface of a substrate (50, 60, 70, 90) which produces a shift between a first state of functioning and a second state of functioning by means of a bimetal-effect thermal actuator, the aforesaid actuator including a deformable element (51, 61, 71, 92) attached, at opposite ends, to the surface of the substrate, the deformable element being deflected and concave in a first direction with respect to the surface of the substrate and being non-planar and non-stressed when in the first state of functioning, and wherein temperature variation from a first temperature to a second temperature causes the actuator to shift and remain into the second state of functioning while at the second temperature, said actuator shifting back into the first state of functioning when the temperature variation is no longer present, the temperature variation inducing the deformable element (51, 61, 71, 92) to deflect in a direction opposite to the first direction.

2. Microsystem according to claim 1, characterized in that the aforesaid first state of functioning corresponds to a position of the deformable element (61) closest from the aforesaid surface of the substrate (60), the aforesaid second state of functioning corresponding to a position of the deformable element (61) furthest to the aforesaid surface of the substrate (60).

3. Microsystem according to claim 2, characterized in that the deformable element (71) has a central part (72) which is thicker than its peripheral part.

4. Microsystem according to any of claims 1 to 2, characterized in that the deformable element (71) has a central part (72) which is thicker than its peripheral part.

5. Microsystem according to claim 4, characterized in that the substrate (50, 60, 70, 90) is a material chosen from glass and silicon.

6. Microsystem according to any of claims 1 to 4, characterized in that the substrate (50, 60, 70, 90) is a material chosen from glass and silicon.

7. Microsystem according to claim 6, characterized in that the deformable element (51, 61, 71, 92) is made of a material chosen from $Si_3N_4$ and $SiO_2$.

8. Microsystem according to claim 6, characterized in that the thermal sensor with bimetal effect is made of a layer of a material chosen from $Si_3N_4$ and $SiO_2$ associated with an aluminum layer.

9. Microsystem according to claim 1, further comprising: a system of electrodes (53, 54, 55) being provided in the microsystem, on the surface of the substrate (50) and on the deformable element (51) so that there is electrical continuity between the electrodes (53, 54, 55) in one of the aforesaid states of functioning and an absence of electrical continuity in the other aforesaid states of functioning.

10. Microsystem according to claim 9, characterized in that localized contact zones (76) are included on the electrode system.

11. Microsystem according to claim 1 characterized in that the thermal actuator with bimetal effect is made of a layer of a material chosen from $Si_3N_4$ and $SiO_2$ associated with an aluminum layer.

12. Microswitch made of a microsystem according to claim 11, a system of electrodes (53, 54, 55) being provided in the microsystem, on the surface of the substrate (5) and on the deformable element (51) so that there is electrical continuity between the electrodes (53, 54, 55) in one of the aforesaid states of functioning and an absence of electrical continuity in the other aforesaid states of functioning.

13. Microvalve composed of a microsystem according to claim 11, at least one fluid connection orifice (91) being included in the microsystem so that it is blocked in one of the states of functioning and open in the other of the aforesaid states of functioning.

14. Microsystem according to any of claims 1 to 6, characterized in that the deformable element (51, 61, 71, 92) is made of a material chosen from $Si_3N_4$ and $SiO_2$.

15. Microsystem according to claim 1, characterized in that the aforesaid first state of functioning corresponds to a position of the deformable element (51) furthest from the aforesaid surface of the substrate (50), the aforesaid second state of functioning corresponding to a position of the deformable element (51) nearest to the aforesaid surface of the substrate.

16. Microsystem according to claim 1, further comprising: at least one fluid connection orifice (91) which is blocked in one of the states of functioning and open in the other of the aforesaid states of functioning.

* * * * *